(12) United States Patent
Chao et al.

(10) Patent No.: US 7,919,229 B2
(45) Date of Patent: Apr. 5, 2011

(54) PHOSPHOR COATING PROCESS FOR LIGHT EMITTING DIODE

(75) Inventors: Tzu-Hao Chao, Taipei (TW); Yi-Tsuo Wu, Jhonghe (TW)

(73) Assignee: Everlight Electronics Co., Ltd., Tu Chen, Taipei Hsien (TW)

( * ) Notice: Subject to any disclaimer, the term of this patent is extended or adjusted under 35 U.S.C. 154(b) by 900 days.

(21) Appl. No.: 11/892,002

(22) Filed: Aug. 17, 2007

(65) Prior Publication Data

US 2008/0254393 A1    Oct. 16, 2008

(30) Foreign Application Priority Data

Apr. 11, 2007    (TW) ............................... 96112770 A

(51) Int. Cl.
*H01L 33/00*    (2010.01)
(52) U.S. Cl. ....................................... 430/319; 430/321
(58) Field of Classification Search .................. None
See application file for complete search history.

(56) References Cited

U.S. PATENT DOCUMENTS

| 6,627,060 | B1 | 9/2003 | Yum et al. |
| 2003/0181122 | A1 | 9/2003 | Collins, III et al. |
| 2004/0072106 | A1 * | 4/2004 | Chua et al. .................... 430/320 |
| 2006/0061259 | A1 | 3/2006 | Negley |
| 2007/0001178 | A1 | 1/2007 | Tran et al. |
| 2007/0045761 | A1 | 3/2007 | Basin et al. |

FOREIGN PATENT DOCUMENTS

| JP | 2000-315062 | 11/2000 |
| JP | 2003-273408 | 9/2003 |
| JP | 2005-311395 | 11/2005 |
| JP | 2007-067420 | 3/2007 |
| JP | 2007-073733 | 3/2007 |

\* cited by examiner

*Primary Examiner* — John A. McPherson
(74) *Attorney, Agent, or Firm* — Muncy, Geissler, Olds & Lowe, PLLC

(57) ABSTRACT

A phosphor coating process for a light-emitting device is described. A light-emitting diode chip is bonded on a substrate. A light-sensitive layer is formed over the light-emitting diode and the substrate. The light-sensitive layer is patterned by a photolithography process to expose an area of the light-emitting diode chip, on which desires a phosphor coating. A phosphor-adhesive material is filled on the area of the light-emitting diode chip.

2 Claims, 4 Drawing Sheets

PHOSPHOR COATING PROCESS FOR LIGHT EMITTING DIODE

RELATED APPLICATIONS

This application claims priority to Taiwan Application Serial Number 96112770, filed Apr. 11, 2007, which is herein incorporated by reference.

BACKGROUND

1. Field of Invention

The present invention relates to a phosphor coating process. More particularly, the present invention relates to a phosphor coating process by photolithography.

2. Description of Related Art

A conventional phosphor coating process needs to be customized for different types of LED package. That is, different equipments may be necessary for coating phosphor film in different types of LED package. Therefore, lots of efforts are invested in phosphor coating different types of LED package, and high costs are generated.

In conventional phosphor coating practice, excess phosphor are usually applied on the LED chip during a phosphor coating in order to fully cover all LED chip, and more material costs are generated.

Although a conventional phosphor coating can fully cover all LED chip, the conventional phosphor coating cannot be uniformly formed over all LED chip due to different types of LED package, and a light-emitting efficiency is thus reduced.

Moreover, phosphor powders gather at the bottom of the conventional phosphor coating because of excess phosphors and gravity, such that the light-emitting uniformity is thus reduced.

SUMMARY

It is therefore an objective of the present invention to provide a phosphor coating process for a light-emitting device.

In accordance with the foregoing and other objectives of the present invention, a phosphor coating process as follows is provided for a light-emitting device. A light-emitting diode chip is bonded on a substrate. A light-sensitive layer is formed over the light-emitting diode and the substrate. The light-sensitive layer is patterned by a photolithography process to expose an area of the light-emitting diode chip, on which desires a phosphor coating. A phosphor-adhesive material is filled into the area of the light-emitting diode chip.

In accordance with the foregoing and other objectives of the present invention, another phosphor coating process as follows is provided for a light-emitting device. A light-emitting diode chip is bonded on a substrate. A light-sensitive adhesive layer mixed with phosphor powders is forming over the light-emitting diode and the substrate. The light-sensitive layer is patterned by a photolithography process to expose an area of the light-emitting diode chip, where bonding pads are located. A metallic wire is formed to electrically interconnect the bonding pads with an outer circuit board.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
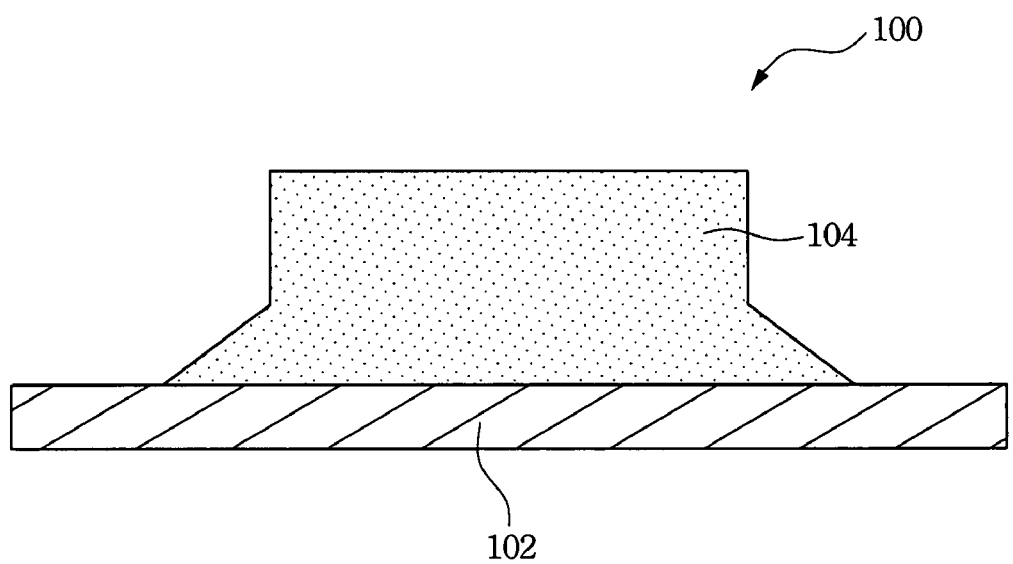
FIGS. 1~7 illustrates a series of cross-sectional views of forming a phosphor coating over an LED device.

Reference will now be made in detail to the present preferred embodiments of the invention, examples of which are illustrated in the accompanying drawings. Wherever possible, the same reference numbers are used in the drawings and the description to refer to the same or like parts.

FIGS. 1~7 illustrates a series of cross-sectional views of forming a phosphor coating over an LED device. The LED device 100 includes a substrate 102 and a light-emitting diode chip 104.

Referring to FIG. 1, the substrate 102 can be made of silicon, ceramic material, polymer, plastics or metal materials. The light-emitting diode chip 104 may be bonded on the substrate 102 by eutectic bonding, flip chip bonding or CSP (Chip Size Package) way.

Figure 2:
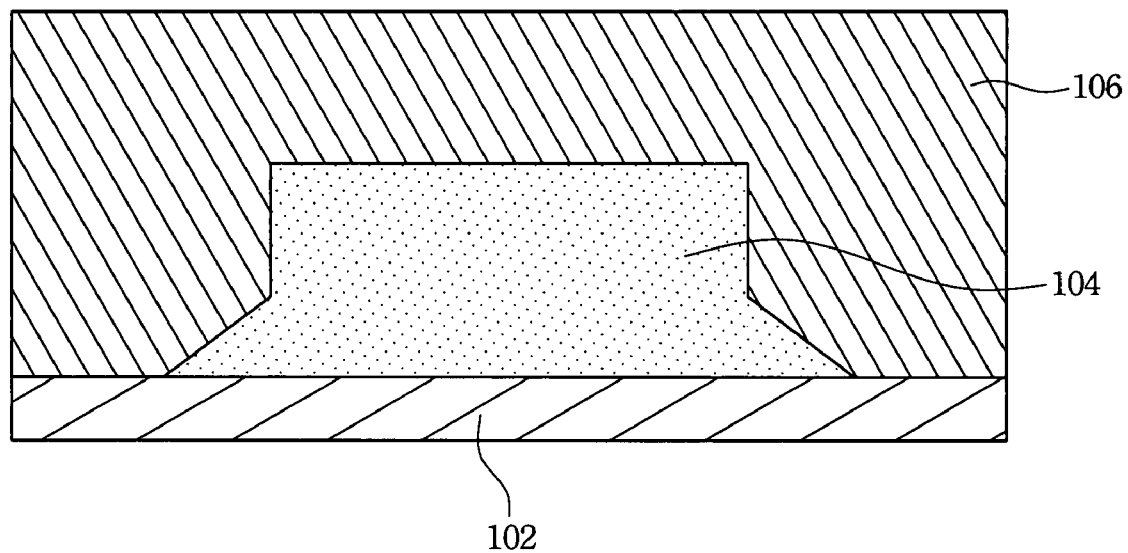

Referring to FIG. 2, a light-sensitive layer 106 is uniformly coated (by spin coating etc) over all the substrate 102 and the light-emitting diode chip 104. The light-sensitive layer 106 may be treated by soft baking or hard baking before exposing process or developing process.

Figure 3:
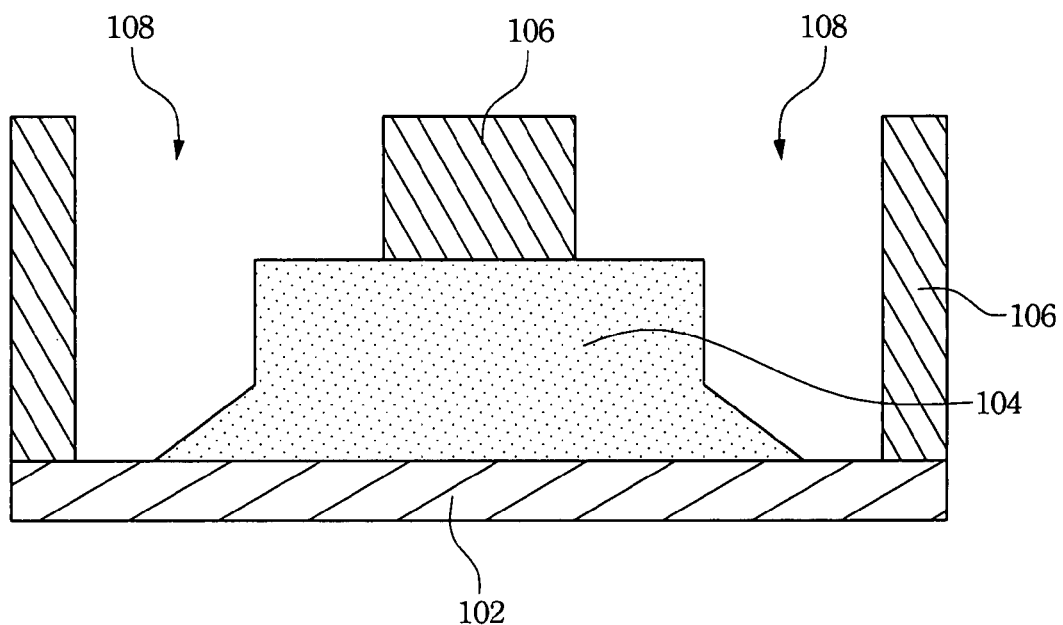

Referring to FIG. 3, the light-sensitive layer 106 is patterned by a photolithography process, namely exposing to light and developing, such that etched portions 108 of the light-sensitive layer 106 expose the areas, on which desires phosphor coating, of the light-emitting diode chip 104.

Figure 4:
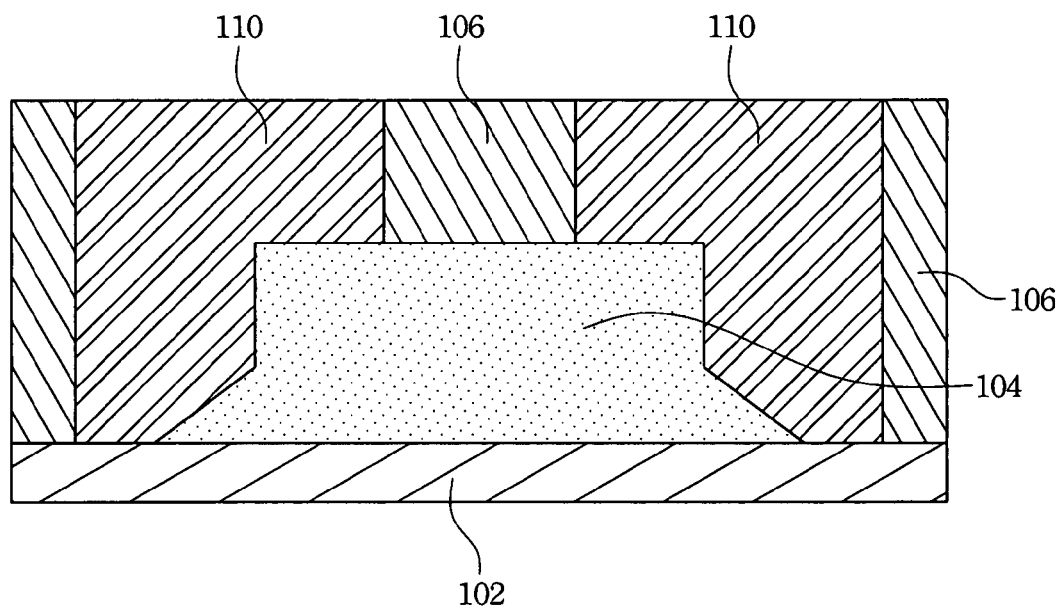

Referring to FIG. 4, a phosphor-adhesive material 110, which is provided by mixing phosphor powders with silicone adhesive or polymer adhesive, is filled into the etched portions 108. Some baking step may be added to cure the phosphor-adhesive material 110 faster.

Figure 5:
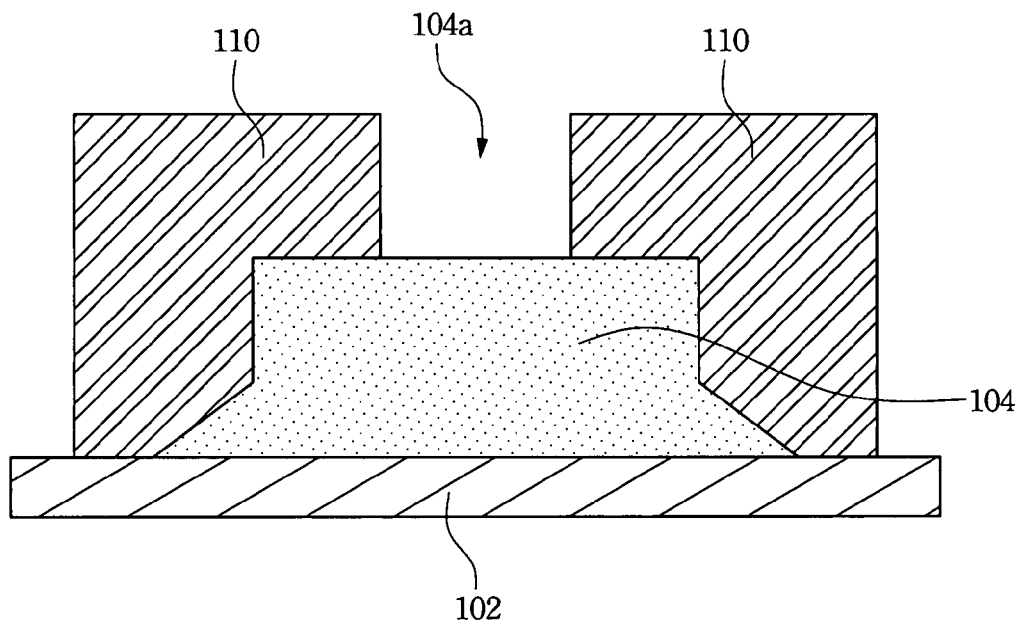

Referring to FIG. 5, remaining light-sensitive layer 106 is removed by applying proper etching chemicals so as to expose a bonding pad area 104a on the light-emitting diode chip 104 and bonding pad areas 102a on the substrate 102.

A polishing process (such as chemical-mechanical polishing) may be added between the step of FIG. 4 and the step of FIG. 5 when the phosphor-adhesive material 110 is filled into the etched portions 108 improperly, i.e. excess phosphor-adhesive material is filled. The polishing process is to flatten an upper surface of the light-sensitive layer 106 after the phosphor-adhesive material 110 is filled into the etched portions 108.

Figure 6:
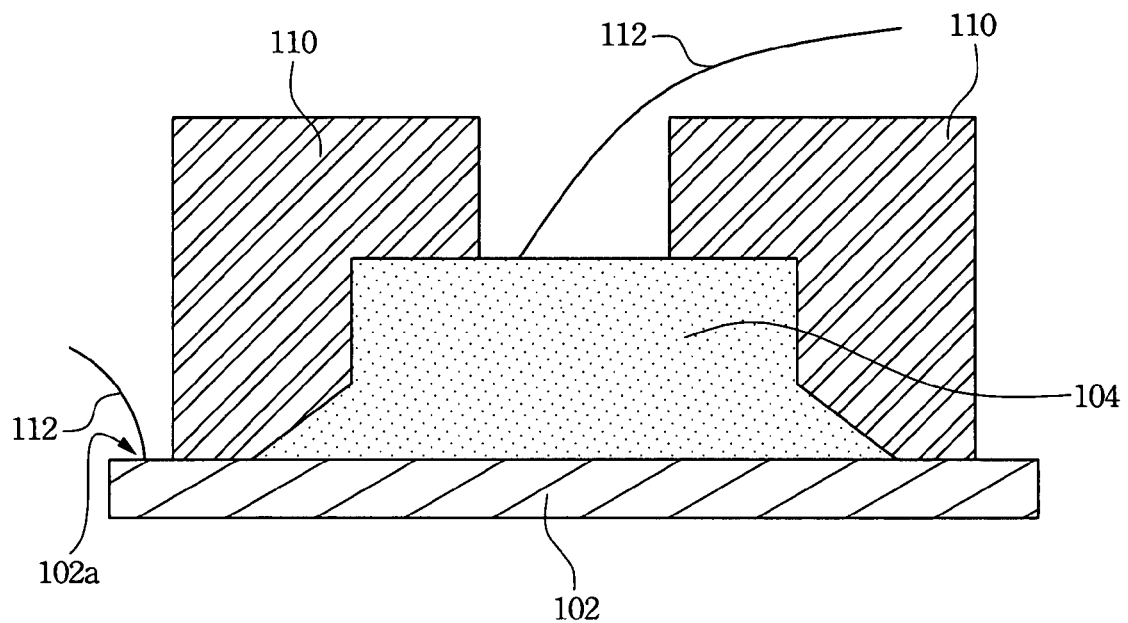

Referring to FIG. 6, metallic wires 112 are bonded on the bonding pad area 104a and the bonding pad areas 102a, and electrically connected to an outer circuit board (not illustrated in drawings).

Figure 7:
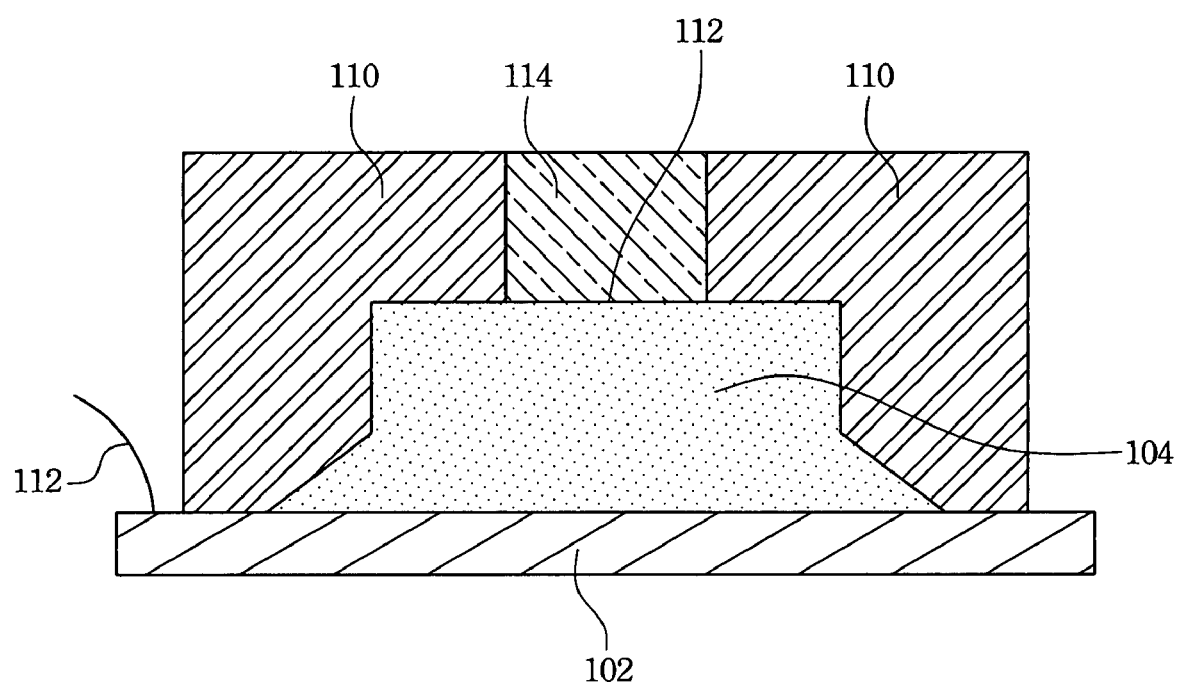

Referring to FIG. 7, an adhesive material 114, which may contains phosphor powders, can be further filled into the bonding pad area 104a and/or the bonding pad areas 102a.

Since above embodiment is exemplary, the positions where bonding pads and/or phosphor coating are located should not be restricted to the positions illustrated in FIGS. 1~7.

In an alternate embodiment, the light-sensitive layer can be replaced by a light-sensitive adhesive layer, such as adhesive materials M10P and M300P provided by American company DOW Corning. The light-sensitive adhesive layer, which is further mixed with phosphor powders, is coated over all the substrate 102 and the light-emitting diode chip 104. The light-sensitive adhesive layer is further patterned by photolithography process to expose the areas where bonding pads are located. Metallic wires are then bonded on the bonding pad areas, and electrically connected to an outer circuit board. This embodiment can save several steps of last embodiment, and a process time of this embodiment is thus reduced.

According to above embodiments, the phosphor coating processes of the present invention is able to precisely and rapidly coat a uniform phosphor film over a light-emitting diode chip and a substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phosphor coating process for a light-emitting device, comprising the following steps:
   bonding a light-emitting diode chip on a substrate;
   forming a light-sensitive adhesive layer mixed with phosphor powders over the light-emitting diode and the substrate;
   patterning a light-sensitive layer by a photolithography process to expose an area of the light-emitting diode chip, where bonding pads are located; and
   forming a metallic wire to electrically interconnect the bonding pads with an outer circuit board.

2. The phosphor coating process of claim 1, wherein the photolithography process comprises a light exposing process and a developing process.

* * * * *